(12) United States Patent
Folkmann et al.

(10) Patent No.: US 12,381,514 B2
(45) Date of Patent: Aug. 5, 2025

(54) POWER MANAGEMENT CIRCUIT SUPPORTING PHASE CORRECTION IN AN ANALOG SIGNAL

(71) Applicant: Qorvo US, Inc., Greensboro, NC (US)

(72) Inventors: Andrew F. Folkmann, Cedar Rapids, IA (US); Nadim Khlat, Cugnaux (FR); Mark Connor, Vinton, IA (US)

(73) Assignee: Qorvo US, Inc., Greensboro, NC (US)

( * ) Notice: Subject to any disclaimer, the term of this patent is extended or adjusted under 35 U.S.C. 154(b) by 760 days.

(21) Appl. No.: 17/536,189

(22) Filed: Nov. 29, 2021

(65) Prior Publication Data

US 2022/0368283 A1  Nov. 17, 2022

Related U.S. Application Data

(60) Provisional application No. 63/188,029, filed on May 13, 2021, provisional application No. 63/188,023, filed on May 13, 2021.

(51) Int. Cl.
  *H03F 1/02*   (2006.01)
  *H03F 3/195*  (2006.01)
  *H03F 3/24*   (2006.01)

(52) U.S. Cl.
  CPC ........... *H03F 1/0222* (2013.01); *H03F 3/195* (2013.01); *H03F 3/245* (2013.01); *H03F 2200/102* (2013.01); *H03F 2200/451* (2013.01)

(58) Field of Classification Search
  CPC ........ H03F 1/0222; H03F 3/195; H03F 3/245; H03F 2200/102; H03F 2200/451; H03F 1/3288; H03F 3/19

(Continued)

(56) References Cited

U.S. PATENT DOCUMENTS 6,621,433 B1   9/2003  Hertz
7,546,137 B2   6/2009  D'Hont et al.
(Continued)

OTHER PUBLICATIONS

Non-Final Office Action for U.S. Appl. No. 17/564,734, mailed Jul. 17, 2024, 9 pages.

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A power management circuit supporting phase correction in an analog signal is disclosed. The power management circuit includes a power amplifier circuit configured to amplify an analog signal having a time-variant power envelope based on a modulated voltage. The power management circuit also includes an envelope tracking (ET) integrated circuit (ETIC) configured to generate the modulated voltage and a modulated phase correction voltage to thereby cause a phase change in the analog signal. In embodiments disclosed herein, a correlation between the time-variant power envelope, the modulated voltage, and the modulated phase correction voltage is explored to thereby allow the ETIC to generate the modulated voltage and the modulated phase correction voltage based on the time-variant power envelope. As a result, it is possible to enable good time and phase alignment between the modulated voltage and the time-variant power envelope to thereby improve efficiency and linearity of the power amplifier circuit.

20 Claims, 4 Drawing Sheets

(58) Field of Classification Search
USPC .......................................................... 330/297
See application file for complete search history.

(56) References Cited

U.S. PATENT DOCUMENTS

| | | |
|---|---|---|
| 7,977,919 B1 | 7/2011 | Jaoude et al. |
| 9,577,771 B1 | 2/2017 | Lashkarian et al. |
| 9,755,579 B1 | 9/2017 | Ahmed et al. |
| 11,165,515 B2 | 11/2021 | Tiebout et al. |
| 11,533,068 B1 | 12/2022 | Sharma et al. |
| 2007/0189417 A1 | 8/2007 | Waheed et al. |
| 2012/0140852 A1 | 6/2012 | Kato et al. |
| 2016/0164551 A1 | 6/2016 | Khlat et al. |
| 2016/0249300 A1* | 8/2016 | Tsai .................. H04B 17/13 |
| 2022/0069774 A1 | 3/2022 | Emira et al. |
| 2022/0368293 A1 | 11/2022 | Khlat |
| 2022/0368294 A1 | 11/2022 | Khlat |
| 2022/0368295 A1 | 11/2022 | Khlat |
| 2022/0368300 A1 | 11/2022 | Khlat |
| 2023/0080652 A1 | 3/2023 | Khlat et al. |

OTHER PUBLICATIONS

Non-Final Office Action for U.S. Appl. No. 17/552,791, mailed Jun. 21, 2024, 6 pages.
Final Office Action for U.S. Appl. No. 17/564,734, mailed Sep. 25, 2024, 10 pages.
Non-Final Office Action for U.S. Appl. No. 17/564,852, mailed Oct. 1, 2024, 9 pages.
Non-Final Office Action for U.S. Appl. No. 17/536,234, mailed Oct. 16, 2024, 17 pages.
Notice of Allowance for U.S. Appl. No. 17/552,791, mailed Oct. 15, 2024, 7 pages.

\* cited by examiner

POWER MANAGEMENT CIRCUIT SUPPORTING PHASE CORRECTION IN AN ANALOG SIGNAL

RELATED APPLICATIONS

This application claims the benefit of provisional patent application Ser. No. 63/188,023, filed May 13, 2021, and provisional patent application Ser. No. 63/188,029, filed May 13, 2021, the disclosures of which are hereby incorporated herein by reference in their entireties.

FIELD OF THE DISCLOSURE

The technology of the disclosure relates generally to a power management circuit configured to enable phase correction in an analog signal.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal (s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to misalign in time and/or phase with the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good time and phase alignment between the time-variant ET voltage and the time-variant power envelope of the RF signal(s).

SUMMARY

Aspects disclosed in the detailed description include a power management circuit supporting phase correction in an analog signal. The power management circuit includes a power amplifier circuit configured to amplify an analog signal having a time-variant power envelope based on a modulated voltage. The power management circuit also includes an envelope tracking (ET) integrated circuit (ETIC) configured to generate the modulated voltage and a modulated phase correction voltage to thereby cause a phase change in the analog signal. In embodiments disclosed herein, a correlation between the time-variant power envelope, the modulated voltage, and the modulated phase correction voltage is explored to thereby allow the ETIC to generate the modulated voltage and the modulated phase correction voltage based on the time-variant power envelope of the analog signal. As a result, it is possible to enable good time and phase alignment between the modulated voltage and the time-variant power envelope to thereby improve efficiency and linearity of the power amplifier circuit.

In one aspect, a power management circuit is provided. The power management circuit includes a power amplifier circuit configured to amplify an analog signal based on a modulated voltage. The power management circuit also includes an ETIC. The ETIC includes a voltage modulation circuit. The voltage modulation circuit is configured to receive an envelope indication signal corresponding to a time-variant power envelope of the analog signal. The voltage modulation circuit is also configured to generate the modulated voltage based on the envelope indication signal. The ETIC also includes a phase correction circuit. The phase correction circuit is configured to generate a modulated phase correction voltage based on the envelope indication signal to thereby cause a phase change in the analog signal.

In another aspect, a power management circuit is provided. The power management circuit includes a power amplifier circuit configured to amplify an analog signal based on a modulated voltage. The power management circuit also includes an ETIC. The ETIC is configured to generate the modulated voltage. The power management circuit also includes a transceiver circuit. The transceiver circuit is configured to generate the analog signal having a time-variant power envelope. The transceiver circuit is also configured to generate a modulated phase correction voltage based on the time-variant power envelope of the analog signal. The transceiver circuit is also configured to generate an envelope indication signal that indicates the modulated phase correction voltage. The transceiver circuit is also configured to provide the envelope indication signal to the ETIC to thereby cause a phase change in the analog signal at the power amplifier circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a power management circuit supporting phase correction in an analog signal. The power management circuit includes a power amplifier circuit configured to amplify an analog signal having a time-variant power envelope based on a modulated voltage. The power management circuit also includes an envelope tracking (ET) integrated circuit (ETIC) configured to generate the modulated voltage and a modulated phase correction voltage to thereby cause a phase change in the analog signal. In embodiments disclosed herein, a correlation between the time-variant power envelope, the modulated voltage, and the modulated phase correction voltage is explored to thereby allow the ETIC to generate the modulated voltage and the modulated phase correction voltage based on the time-variant power envelope of the analog signal. As a result, it is possible to enable good time and phase alignment between the modulated voltage and the time-variant power envelope to thereby improve efficiency and linearity of the power amplifier circuit.

Figure 1:
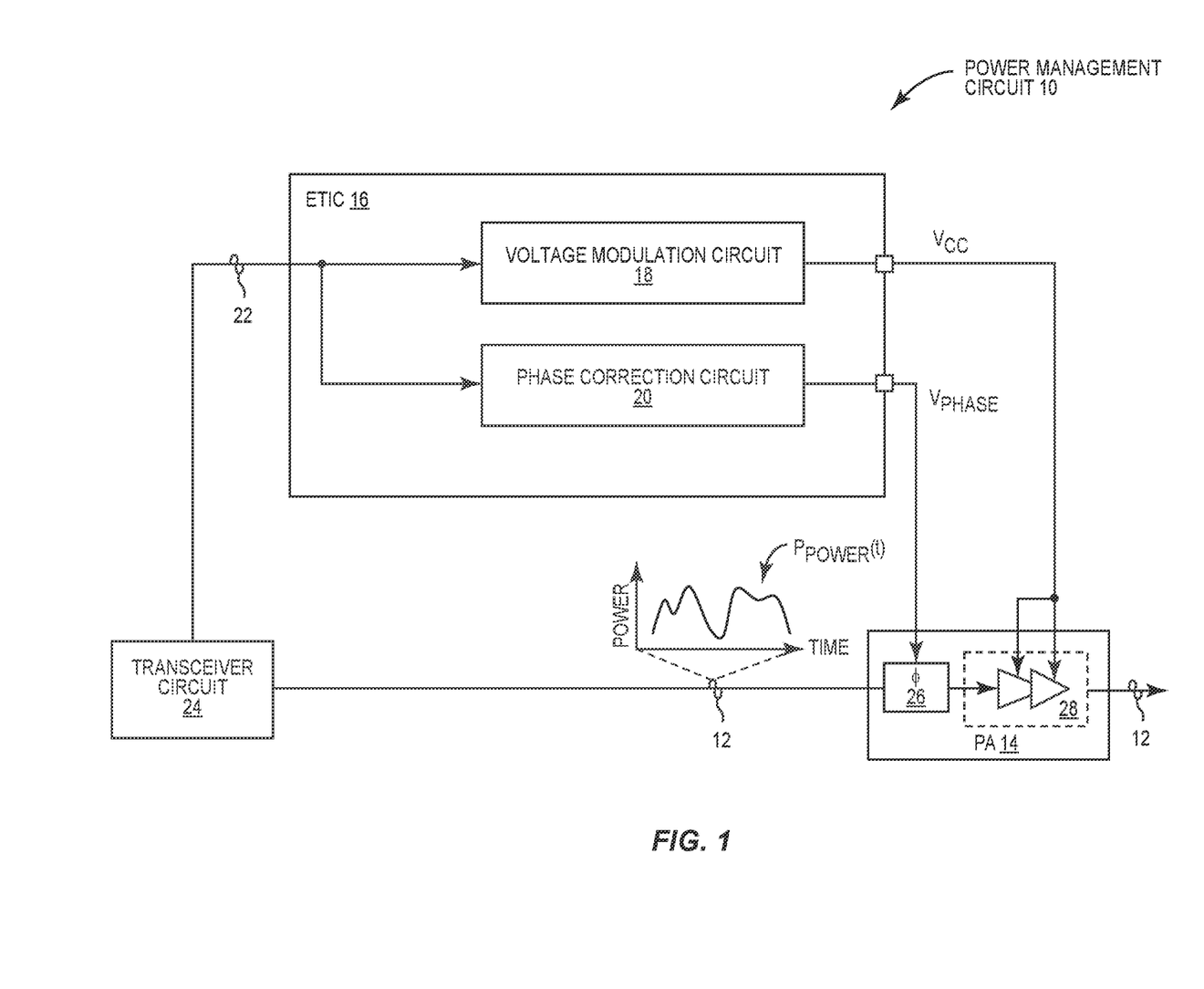
FIG. 1 is a schematic diagram of an exemplary power amplifier circuit that can be adapted according to various embodiments of the present disclosure to support phase correction in an analog signal.

FIG. 1 is a schematic diagram of an exemplary power amplifier circuit 10 that can be adapted according to various embodiments of the present disclosure to support phase correction in an analog signal 12. The power management circuit 10 includes a power amplifier circuit 14 and an ETIC 16. The power amplifier circuit 14 is configured to amplify the analog signal 12 based on a modulated voltage $V_{CC}$, which can be an ET modulated voltage or an average power tracking (APT) modulated voltage. The ETIC 16 is configured to generate the modulated voltage $V_{CC}$, which tracks a time-variant power envelope $P_{POWER}(t)$ of the analog signal 12, and a modulated phase correction voltage $V_{PHASE}$ to thereby cause a phase change in the analog signal 12. In embodiments disclosed herein, a correlation between the time-variant power envelope $P_{POWER}(t)$, the modulated voltage $V_{CC}$, and the modulated phase correction voltage $V_{PHASE}$ is explored to thereby allow the ETIC 16 to generate the modulated voltage $V_{CC}$ and the modulated phase correction voltage $V_{PHASE}$ based on the time-variant power envelope $P_{POWER}(t)$ of the analog signal 12. As a result, it is possible to enable good time and phase alignment between the modulated voltage $V_{CC}$ and the time-variant power envelope $P_{POWER}(t)$ to thereby improve efficiency and linearity of the power amplifier circuit 14.

The ETIC 16 includes a voltage modulation circuit 18 and a phase correction circuit 20. The voltage modulation circuit 18 receives an envelope indication signal 22. In various embodiments further discussed in FIGS. 2-4, the envelope indication signal 22 can be adapted to indicate the time-variant power envelope $P_{POWER}(t)$ in a number of ways. Accordingly, the voltage modulation circuit 18 can be configured to generate the modulated voltage $V_{CC}$ and the phase correction circuit 20 can be configured to generate the modulated phase correction voltage $V_{PHASE}$ all based on the envelope indication signal 22.

In an embodiment, the power management circuit 10 can include or be coupled to a transceiver circuit 24. The transceiver circuit 24 can be configured to generate and provide the analog signal 12 to the power amplifier circuit 14. In addition, the transceiver circuit 24 is also configured to generate and provide the envelope indication signal 22 to the ETIC 16. Given that the transceiver circuit 24 generates the analog signal 12 associated with the time-variant power envelope $P_{POWER}(t)$, the transceiver circuit 24 is able to provide an indication of the time-variant power envelope $P_{POWER}(t)$ via the envelope indication signal 22.

The power amplifier circuit 14 can be configured to include a phase shifter circuit 26 and a power amplifier 28. The phase shifter circuit 26 is coupled to the phase correction circuit 20 to receive the modulated phase correction voltage $V_{PHASE}$. The phase shifter circuit 26 may include internal storage (not shown), such as registers for example, to store a correlation between various levels of the modulated phase correction voltage $V_{PHASE}$ and various degrees of phase shift. For example, storing a correlation between the modulated phase correction voltage $V_{PHASE}$ of 0 V, 1 V, and 2 V and a phase shift of 0°, 1°, and 2°, respectively. Accordingly, the phase shifter circuit 26 can determine a phase shift based on the modulated phase correction voltage $V_{PHASE}$ and phase-shift the analog signal 12 based on the determined phase shift.

In one embodiment, the phase shifter circuit 26 can operate as a passive phase shift to only cause the phase change in the analog signal 12. As such, the modulated phase correction voltage $V_{PHASE}$ does not need to convey power to the phase shifter circuit 26. In another embodiment, the phase shifter circuit 26 can operate as an active phase shift to not only cause the phase change in the analog signal 12, but also amplify the analog signal 12. As such, the modulated phase correction voltage $V_{PHASE}$ needs to convey power to the phase shifter circuit 26.

The power amplifier 28 can be any type of power amplifier, including but not limited to a Doherty power amplifier, differential power amplifier, multi-stage power amplifier, single-stage power amplifier, etc. The power amplifier 28 is coupled to the phase shifter circuit 26 to amplify the analog signal 12, which may have been phase-shifted and/or amplitude-adjusted by the phase shifter circuit 26.

The various embodiments of the power management circuit 10 are now discussed in detail with reference to FIGS. 2-4.

Figure 2:
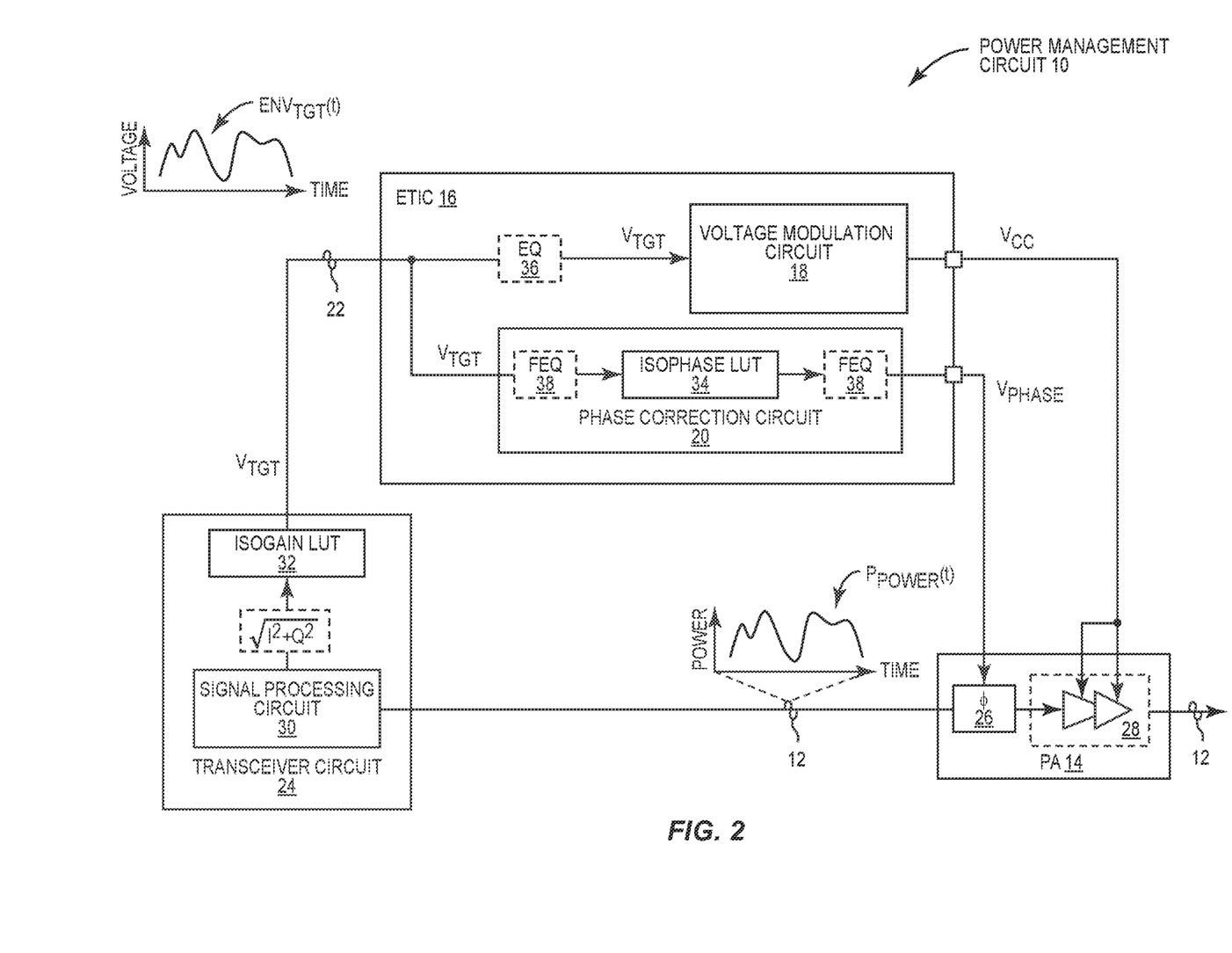
FIG. 2 is a schematic diagram providing an exemplary illustration of the power amplifier circuit of FIG. 1 configured according to one embodiment of the present disclosure.

FIG. 2 is a schematic diagram providing an exemplary illustration of the power management circuit 10 of FIG. 1 configured according to one embodiment of the present disclosure. Common elements between FIGS. 1 and 2 are shown therein with common element numbers and will not be re-described herein.

Herein, the transceiver circuit 24 is configured to include a signal processing circuit 30 and a target voltage circuit 32. The signal processing circuit 30 is configured to generate the analog signal 12 and, accordingly, the time-variant power envelope $P_{POWER}(t)$. In a non-limiting example, the signal processing circuit 30 can include a digital baseband circuit (not shown) that generates a digital version of the analog signal 12 and a digital-to-analog converter (not shown) to convert the digital version of the analog signal 12 into the analog signal 12. In an embodiment, the digital version of the analog signal 12 can be so generated to include an in-phase (I) component and a quadrature (Q) component. Accordingly, the signal processing circuit 30 can sample the time-variant power envelope $P_{POWER}(t)$ to thereby determine a time-variant amplitude (expressed as $\sqrt{I^2+Q^2}$) of the time-variant power envelope $P_{POWER}(t)$.

In an embodiment, the target voltage circuit 32 can be configured to include an isogain lookup table (LUT) pre-configured to correlate the time-variant amplitude ($\sqrt{I^2+Q^2}$) of the time-variant power envelope $P_{POWER}(t)$ with a target voltage $V_{TGT}$. Herein, the term "isogain" refers to a constant gain relative to the time-variant amplitude ($\sqrt{I^2+Q^2}$) of the time-variant power envelope $P_{POWER}(t)$.

As such, the target voltage circuit 32 can generate the target voltage $V_{TGT}$ having a time-variant target voltage envelope $ENV_{TGT}(t)$ that tracks the time-variant amplitude ($\sqrt{I^2+Q^2}$) of the time-variant power envelope $P_{POWER}(t)$ based on the isogain LUT. Accordingly, the target voltage circuit 32 can generate the envelope indication signal 22 to indicate the target voltage $V_{TGT}$ in association with the time-variant target voltage envelope $ENV_{TGT}(t)$ and provide the envelope indication signal 22 to the ETIC 16.

The ETIC 16 is configured to explore a correlation between the time-variant power envelope $P_{POWER}(t)$, the modulated voltage $V_{CC}$, and the modulated phase correction voltage $V_{PHASE}$ such that the modulated voltage $V_{CC}$ and the modulated phase correction voltage $V_{PHASE}$ can both be generated based on the time-variant target voltage envelope $ENV_{TGT}(t)$ of the target voltage $V_{TGT}$. As mentioned earlier, the time-variant amplitude ($\sqrt{I^2+Q^2}$) is sampled from the time-variant power envelope $P_{POWER}(t)$ and the target voltage $V_{TGT}$ is generated based on the time-variant amplitude ($\sqrt{I^2+Q^2}$). In this regard, the target voltage $V_{TGT}$ is a function $F_V(\ )$ of the time-variant power envelope $P_{POWER}(t)$, as expressed in equation (Eq. 1) below.

$$V_{TGT}=F_V(P_{POWER}(t)) \quad \text{(Eq. 1)}$$

The modulated phase correction voltage $V_{PHASE}$ can be a function $F_\phi(\ )$ of the time-variant power envelope $P_{POWER}(t)$, as expressed in equation (Eq. 2) below. In a non-limiting example, the function $F_\phi(\ )$ an be established by an isophase LUT 34 in the phase correction circuit 20.

$$V_{PHASE}=F_\phi(P_{POWER}(t)) \quad \text{(Eq. 2)}$$

From equation (Eq. 1), the time-variant power envelope $P_{POWER}(t)$ can be expressed as a function of the target voltage $V_{TGT}$, as shown in equation (Eq. 3) below.

$$P_{POWER}(t)=F_V^{-1}(V_{TGT}) \quad \text{(Eq. 3)}$$

By substituting the time-variant power envelope $P_{POWER}(t)$ in equation (Eq. 2) with the time-variant power envelope $P_{POWER}(t)$ in equation (Eq. 3), the modulated phase correction voltage $V_{PHASE}$ becomes a function of the target voltage $V_{TGT}$, as expressed in equation (Eq. 4) below.

$$V_{PHASE}=F_\phi(F_V^{-1}(V_{TGT})) \quad \text{(Eq. 4)}$$

As shown in the equation (Eq. 4), it is possible to generate the modulated phase correction voltage $V_{PHASE}$ from the target voltage $V_{TGT}$ based on the function $F_\phi(F_V^{-1}(\ ))$. In a non-limiting example, the function $F_\phi(F_V^{-1}(\ ))$, which correlates the target voltage $V_{TGT}$ with the modulated phase correction voltage $V_{PHASE}$, can be established by an isophase LUT 34 in the phase correction circuit 20. As a result, the ETIC 16 can be configured to generate both the modulated voltage $V_{CC}$ and the modulated phase correction voltage $V_{PHASE}$ based on the target voltage $V_{TGT}$, as indicated by the envelope indication signal 22.

Accordingly, the voltage modulation circuit 18 can be configured to generate the modulated voltage $V_{CC}$ as an ET modulated voltage based on the target voltage $V_{TGT}$. The voltage modulation circuit 18 is configured to provide the modulated voltage $V_{CC}$ to the power amplifier 28 in the power amplifier circuit 14 for amplifying the analog signal 12.

The ETIC 16 may include a voltage equalizer 36 to equalize the target voltage $V_{TGT}$. In a non-limiting example, the voltage equalizer 36 can implement a second-order complex-zero and a real-zero transfer function to help reduce ripples (a.k.a. voltage disturbance) in the modulated voltage $V_{CC}$, which may be caused by, for example, trace inductance between the ETIC 16 and the power amplifier 28.

In an alternative embodiment, the voltage modulation circuit 18 can also generate the modulated voltage $V_{CC}$ as an APT modulated voltage. In this regard, the target voltage $V_{TGT}$ may instead be associated with a time-invariant target voltage envelope (not shown). Nevertheless, the voltage modulation circuit 18 can still generate the modulated voltage $V_{CC}$ based on the target voltage $V_{TGT}$ indicated by the envelope indication signal 22.

The phase correction circuit 20 may include a frequency equalizer 38. In one embodiment, the frequency equalizer 38 may be provided before the isophase LUT 34 to equalize the target voltage $V_{TGT}$. In another embodiment, the frequency equalizer 38 may be provided after the isophase LUT 34 to equalize the modulated phase correction voltage $V_{PHASE}$. In a non-limiting example, the frequency equalizer 38 can implement a real-zero transfer function to help reduce frequency disturbance in the analog signal 12.

Figure 3:
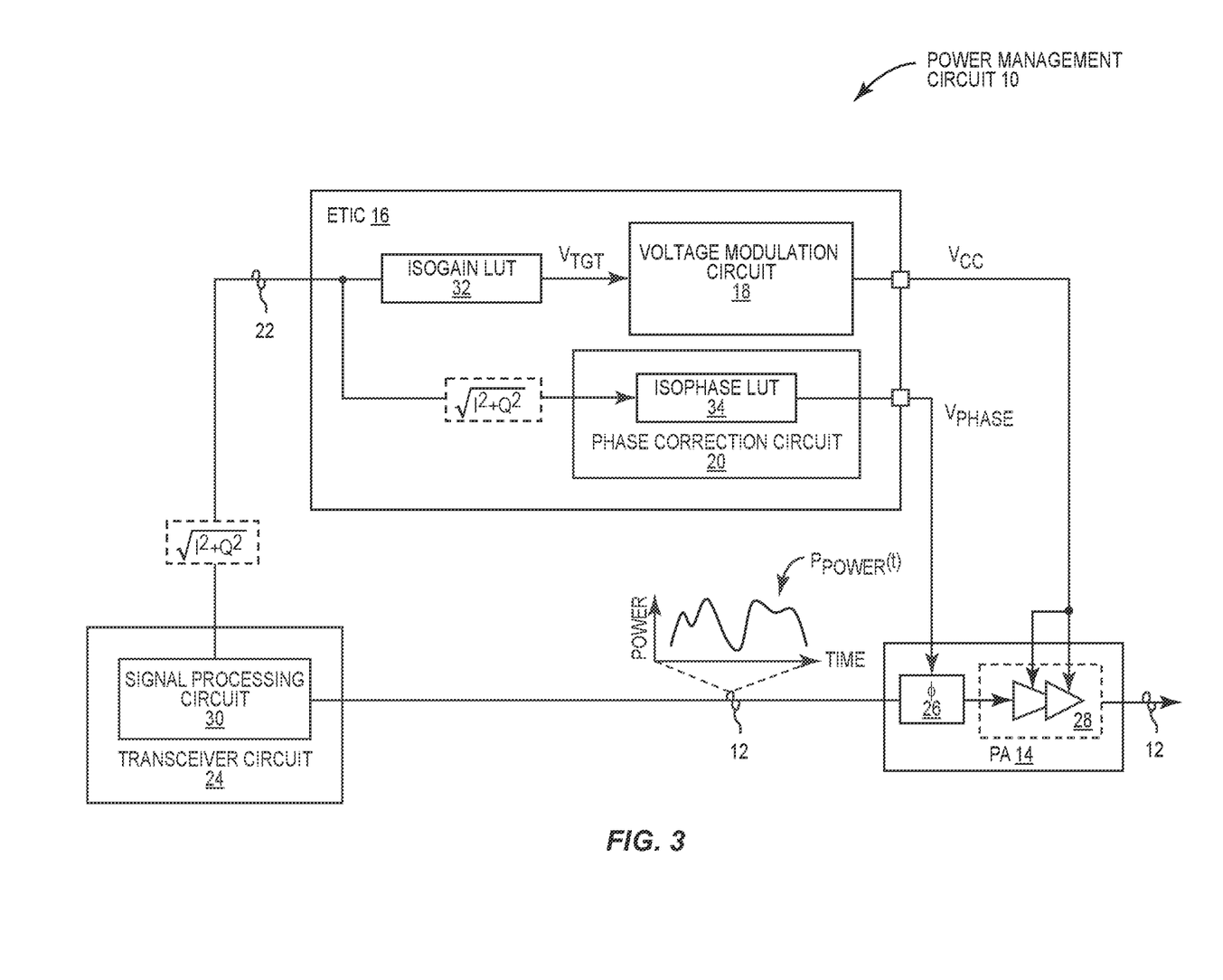
FIG. 3 is a schematic diagram providing an exemplary illustration of the power amplifier circuit of FIG. 1 configured according to another embodiment of the present disclosure.

FIG. 3 is a schematic diagram providing an exemplary illustration of the power management circuit 10 of FIG. 1 configured according to another embodiment of the present disclosure. Common elements between FIGS. 2 and 3 are shown therein with common element numbers and will not be re-described herein.

Herein, the target voltage circuit 32 is moved from the transceiver circuit 24 in FIG. 2 into the ETIC 16. In this regard, the signal processing circuit 30 in the transceiver circuit 24 is instead configured to generate the envelope indication signal 22 that indicates the time-variant amplitude ($\sqrt{I^2+Q^2}$) of the time-variant power envelope $P_{POWER}(t)$. The target voltage circuit 32 in the ETIC 16 is then configured to generate the target voltage $V_{TGT}$ based on the time-variant amplitude ($\sqrt{I^2+Q^2}$) of the time-variant power envelope $P_{POWER}(t)$. The isophase LUT 34, one the other hand, is configured to correlate the time-variant amplitude ($\sqrt{I^2+Q^2}$) of the time-variant power envelope $P_{POWER}(t)$ with the modulated phase correction voltage $V_{PHASE}$.

Figure 4:
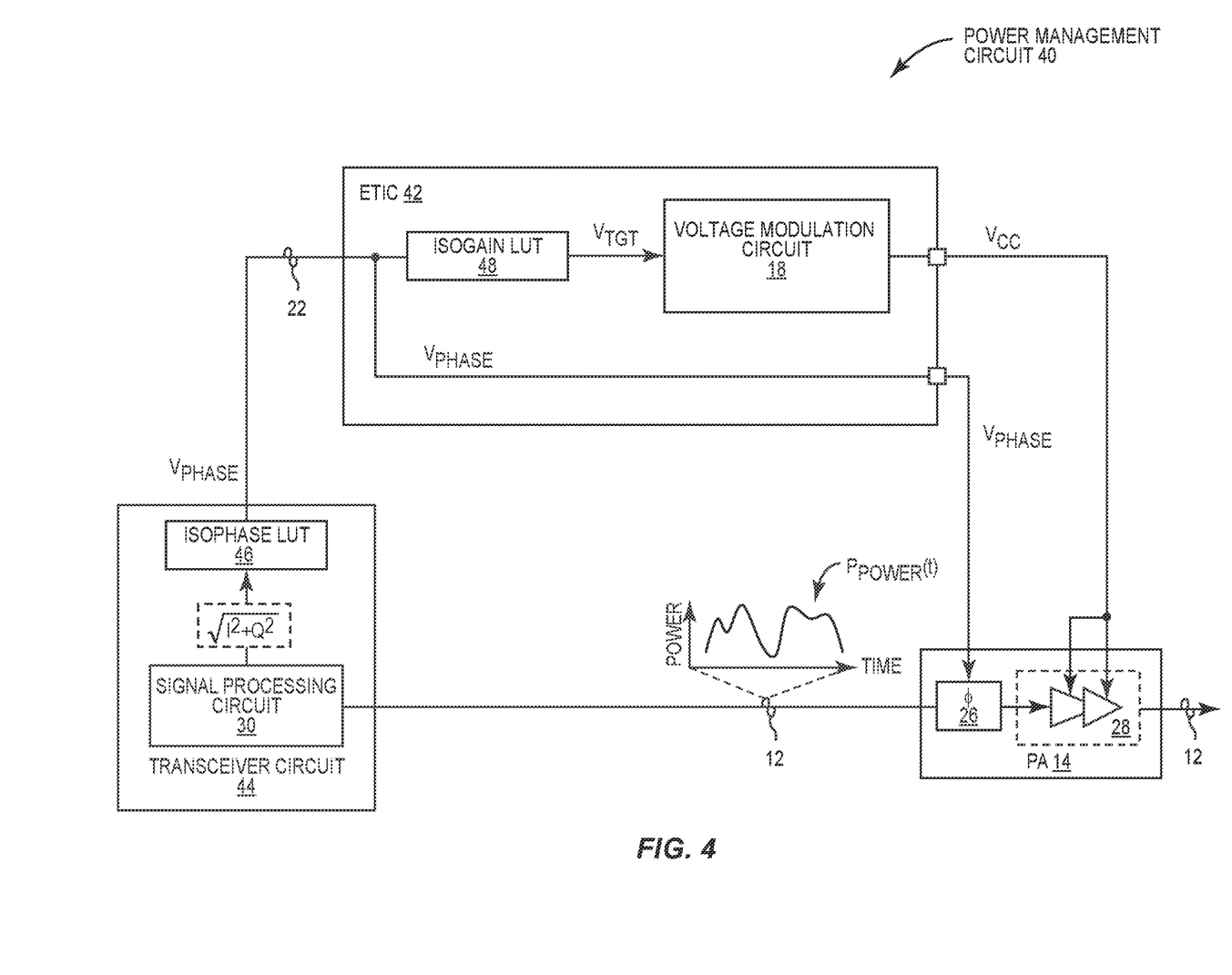
FIG. 4 is a schematic diagram of an exemplary power amplifier circuit configured according to an alternative embodiment of the present disclosure.

FIG. 4 is a schematic diagram of an exemplary power amplifier circuit 40 configured according to an alternative embodiment of the present disclosure. Common elements between FIGS. 2, 3, and 4 are shown therein with common element numbers and will not be re-described herein.

Herein, the power management circuit 40 includes an ETIC 42. The ETIC 42 includes the voltage modulation circuit 18 configured to generate the modulated voltage $V_{CC}$ based on the target voltage $V_{TGT}$. The power management circuit 40 also includes a transceiver circuit 44, which includes the signal processing circuit 30 and an isophase LUT 46. The isophase LUT 46 is configured to correlate the modulated phase correction voltage $V_{PHASE}$ with the time-variant amplitude ($\sqrt{I^2+Q^2}$) of the time-variant power envelope $P_{POWER}(t)$. Accordingly, the transceiver circuit 44 can generate the modulated phase correction voltage $V_{PHASE}$ based on the isophase LUT 46 and generate the envelope indication signal 22 that indicates the modulated phase correction voltage $V_{PHASE}$.

The ETIC 42 includes a target voltage circuit 48, which can implement an isogain LUT that correlates the modulated phase correction voltage $V_{PHASE}$ with the target voltage $V_{TGT}$. Accordingly, the voltage modulation circuit 18 can generate the modulated voltage $V_{CC}$ based on the target voltage $V_{TGT}$.

Those skilled in the art will recognize improvements and modifications to the preferred embodiments of the present disclosure. All such improvements and modifications are considered within the scope of the concepts disclosed herein and the claims that follow.

What is claimed is:

1. A power management circuit comprising:
a power amplifier circuit configured to amplify an analog signal based on a modulated voltage; and
an envelope tracking (ET) integrated circuit (ETIC) comprising:
a voltage modulation circuit configured to:
receive an envelope indication signal corresponding to a time-variant power envelope of the analog signal; and
generate the modulated voltage based on the envelope indication signal; and
a phase correction circuit configured to generate a modulated phase correction voltage based on the envelope indication signal to thereby cause a phase change in the analog signal.

2. The power management circuit of claim 1, wherein the power amplifier circuit comprises a phase shifter circuit configured to:
determine a phase shift corresponding to the modulated phase correction voltage; and
phase-shift the analog signal based on the determined phase shift.

3. The power management circuit of claim 2, wherein the power amplifier circuit further comprises a power amplifier configured to amplify the phase-shifted analog signal based on the modulated voltage.

4. The power management circuit of claim 2, wherein the phase shifter circuit is further configured to adjust an amplitude of the analog signal.

5. The power management circuit of claim 1, further comprising a transceiver circuit configured to generate the envelope indication signal.

6. The power management circuit of claim 5, wherein the transceiver circuit comprises:
a signal processing circuit configured to generate the analog signal having the time-variant power envelope; and
a target voltage circuit configured to:
generate a target voltage that tracks the time-variant power envelope of the analog signal;
generate the envelope indication signal that indicates the target voltage; and
provide the envelope indication signal to the ETIC.

7. The power management circuit of claim 6, wherein the target voltage circuit is further configured to generate the target voltage based on an isogain lookup table (LUT) that correlates a time-variant amplitude of the time-variant power envelope with the target voltage.

8. The power management circuit of claim 6, wherein the phase correction circuit comprises an isophase lookup table (LUT) configured to correlate the target voltage with the modulated phase correction voltage.

9. The power management circuit of claim 6, wherein the ETIC further comprises a voltage equalizer configured to equalize the target voltage.

10. The power management circuit of claim 6, wherein the phase correction circuit comprises a frequency equalizer configured to equalize the target voltage.

11. The power management circuit of claim 6, wherein the phase correction circuit comprises a frequency equalizer configured to equalize the modulated phase correction voltage.

12. The power management circuit of claim 5, wherein the transceiver circuit comprises a signal processing circuit configured to:
   generate the analog signal having the time-variant power envelope;
   generate the envelope indication signal that indicates a time-variant amplitude of the time-variant power envelope; and
   provide the envelope indication signal to the ETIC.

13. The power management circuit of claim 12, wherein:
   the ETIC further comprises a target voltage circuit configured to generate a target voltage based on an isogain lookup table (LUT) that correlates the time-variant amplitude of the time-variant power envelope with the target voltage; and
   the voltage modulation circuit is further configured to generate the modulated voltage based on the target voltage.

14. The power management circuit of claim 12, wherein the phase correction circuit comprises an isophase lookup table (LUT) configured to correlate the time-variant amplitude of the time-variant power envelope with the modulated phase correction voltage.

15. A power management circuit comprising:
   a power amplifier circuit configured to amplify an analog signal based on a modulated voltage;
   an envelope tracking (ET) integrated circuit (ETIC) configured to generate the modulated voltage; and
   a transceiver circuit configured to:
      generate the analog signal having a time-variant power envelope;
      generate a modulated phase correction voltage based on the time-variant power envelope of the analog signal;
      generate an envelope indication signal that indicates the modulated phase correction voltage; and
      provide the envelope indication signal to the ETIC to thereby cause a phase change in the analog signal at the power amplifier circuit.

16. The power management circuit of claim 15, wherein the transceiver circuit comprises:
   a signal processing circuit configured to generate the analog signal having the time-variant power envelope; and
   an isophase lookup table (LUT) configured to:
      generate the modulated phase correction voltage based on a time-variant amplitude of the time-variant power envelope;
      generate the envelope indication signal that indicates the modulated phase correction voltage; and
      provide the envelope indication signal to the ETIC.

17. The power management circuit of claim 16, wherein the ETIC comprises:
   a target voltage circuit configured to generate a target voltage based on an isogain lookup table (LUT) that correlates the modulated phase correction voltage with the target voltage; and
   a voltage modulation circuit configured to generate the modulated voltage based on the target voltage.

18. The power management circuit of claim 17, wherein the power amplifier circuit comprises a phase shifter circuit configured to:
   determine a phase shift corresponding to the modulated phase correction voltage; and
   phase-shift the analog signal to the determined phase shift.

19. The power management circuit of claim 18, wherein the phase shifter circuit is further configured to adjust an amplitude of the analog signal.

20. The power management circuit of claim 18, wherein the power amplifier circuit further comprises a power amplifier configured to amplify the phase-shifted analog signal based on the modulated voltage.

* * * * *

UNITED STATES PATENT AND TRADEMARK OFFICE
CERTIFICATE OF CORRECTION

PATENT NO. : 12,381,514 B2
APPLICATION NO. : 17/536189
DATED : August 5, 2025
INVENTOR(S) : Andrew F. Folkmann et al.

Page 1 of 1

It is certified that error appears in the above-identified patent and that said Letters Patent is hereby corrected as shown below:

In the Specification

In Column 6, Line 41, replace "an be established" with --can be established--.

Signed and Sealed this
Sixteenth Day of September, 2025

Coke Morgan Stewart
*Acting Director of the United States Patent and Trademark Office*